United States Patent [19]

Ogasawara

[11] Patent Number: 5,283,691
[45] Date of Patent: Feb. 1, 1994

[54] SOLID STATE IMAGING APPARATUS
[75] Inventor: Yuji Ogasawara, Tokyo, Japan
[73] Assignee: Olympus Optical Co., Ltd., Tokyo, Japan
[21] Appl. No.: 833,130
[22] Filed: Feb. 10, 1992
[30] Foreign Application Priority Data Feb. 15, 1991 [JP] Japan .................. 3-6331[U]

[51] Int. Cl.[5] .................. G02B 5/18; G02B 27/44; H01L 31/02; H01L 27/14
[52] U.S. Cl. .................. 359/566; 250/239; 359/569; 257/431
[58] Field of Search .................. 357/30 L, 30 M; 359/566, 569, 571, 885; 250/239, 237 G

[56] References Cited

U.S. PATENT DOCUMENTS

| 4,634,219 | 1/1987 | Suzuki | 359/571 |
| 4,795,236 | 1/1989 | Ise | 359/569 |
| 4,878,737 | 11/1989 | Ise | 359/885 |
| 4,989,972 | 2/1991 | Braun | 357/30 L |
| 4,998,801 | 3/1991 | Shiraishi et al. | 359/885 |

FOREIGN PATENT DOCUMENTS

| 59-25268 | 2/1984 | Japan | 357/30 L |
| 59-122087 | 7/1984 | Japan . | |
| 61-176166 | 8/1986 | Japan | 357/30 L |
| 170975 | 11/1988 | Japan . | |
| 63-308831 | 12/1988 | Japan | 357/30 L |
| 1-7562 | 1/1989 | Japan | 357/30 L |

Primary Examiner—Martin Lerner
Attorney, Agent, or Firm—Louis Weinstein

[57] ABSTRACT

A solid state imaging apparatus characterized in that a phase low pass filter is formed by providing an array of recesses and projections having a predetermined repeated pitch on the surface of the light receiving side of a clear molded package of a solid state imaging device. When an object light passes through the phase low pass filter, dot images will be separated by diffraction of the light and an image will be formed on every other unit pixel of the light receiving surface. Thereby, the moire can be removed without using a crystal plate filter or the like.

15 Claims, 4 Drawing Sheets

DOT IMAGE INTENSITY DISTRIBUTION

SOLID STATE IMAGING APPARATUS

BACKGROUND OF THE INVENTION

1. Field of the Invention:

This invention relates to solid state imaging apparatus and more particularly to a solid state imaging apparatus photoelectrically converting an object image to an electric signal and to be used for an electronic still camera or video camera.

2. Related Art Statement:

In an electronic still camera or video camera, there is a characteristic that, in case an image is formed on the light receiving surface of a solid state imaging device and is converted to an electric signal, a moire will be likely to be caused by a spatial frequency. Therefore, usually, as shown in FIG. 8, a low pass filter (abbreviated as an LPF hereinafter) 23 formed of crystal plates to prevent such moire is arranged in the rear of an imaging optical system consisting of zoom lens groups 21 and 22 formed, for example, of two groups. Further, as required, an infrared ray cutting filter 24 for cutting infrared rays is also arranged.

In order that the above mentioned crystal LPF 23 may develop the optical high-frequency cut off effect sufficiently to prevent the moire, the crystal LPF 23 must be arranged accurately to keep a predetermined angle within a plane vertical to the optical axis between the zoom lens groups 21 and 22 formed of two groups and the solid state imaging device 25. Therefore, a solid state imaging apparatus wherein a semiconductor substrate on which are provided respective photosensitive device groups of a solid state imaging device and an optical high-frequency cut off crystal plate arranged in parallel with the above mentioned semiconductor substrate on the incident light path side are integrally fixed so as to be able to be handled as one part is disclosed in the publication of Japanese Patent Application Laid Open No.122087/1984.

Also, a photoelectric transducer device wherein a solid state imaging device itself is made integral by enclosing its sensor part with a resin molding instead of the conventional CCD unit is disclosed, for example, in the publication of Japanese Utility Model Application Laid Open No.170975/1988. This photoelectric transducer device is made by successively laminating a light transmitting conductive film, PIN type amorphous semiconductor layer and conductive film on a light transmitting insulating substrate and is characterized in that the above mentioned light transmitting insulating substrate is a colored glass.

However, in the solid state imaging apparatus wherein a semiconductor substrate on which are provided respective photosensitive device groups of a solid state imaging device and an optical high-frequency cut off crystal plate arranged in parallel with the above mentioned semiconductor substrate on the incident light path side are integrally fixed so as to be able to be handled as one part and which is disclosed in the publication of Japanese Patent Application Laid Open No.122087/1984, it is attempted to dissolve the moire by using the optical high-frequency cut off crystal plate but this crystal plate is expensive. Further, the optical high-frequency cut off crystal plate is only held as mounted on the peripheral edge on a receiving part provided on the semiconductor substrate and is therefore far from one part.

Also, the photoelectric transducer device which is made by successively laminating a light transmitting conductive film, PIN type amorphous semiconductor layer and conductive film on a light transmitting insulating substrate, is characterized in that the above mentioned light transmitting insulating substrate is a colored glass and is disclosed in the above mentioned publication of Japanese Utility Model Application Laid Open No. 170975/1988 is made integral by enclosing the sensor part with a resin molding but has the colored glass which is the light transmitting insulating substrate made separately so that the surface must be ground and is still of a two-body structure.

Now, on the solid state imaging device itself, there is recently established a technique of integrally forming a solid state imaging device including leads by clear molding the chip of the solid state imaging device of a plastic molded transparent resin. The surface of a clear molded package is finely polished to be used as a perfect plane and an optical LPF to remove a moire is separately provided.

For this optical LPF are used not only a crystal plate filter but also a lenticular plate on which are arranged minute cylindrical lenses of a partly arcuate cross-section and a phase filter on which transparent films are formed like stripes by evaporative deposition and which controls a phase filter.

Thus, the solid state imaging device and optical LPF are provided separately from each other and an attempt to combine them into one has never been made.

OBJECTS AND SUMMARY OF THE INVENTION

A first object of this invention is to provide a solid state imaging apparatus in which the above mentioned defects are removed and the phase LPF is not required to be particularly provided and which can be formed at a low cost.

A second object of this invention is to provide a solid state imaging apparatus in which the phase LPF can be formed by being molded integrally with the solid state imaging device.

Briefly, this invention is characterized by forming a phase low pass filter on the light receiving side surface of a clear molded package (packing the solid state imaging device with a transparent member) of a solid state imaging device.

These objects and advantages of the present invention will become more apparent from the following detailed explanation.

DETAILED DESCRIPTION OF THE PREFERRED EMBODIMENT

Figure 1:
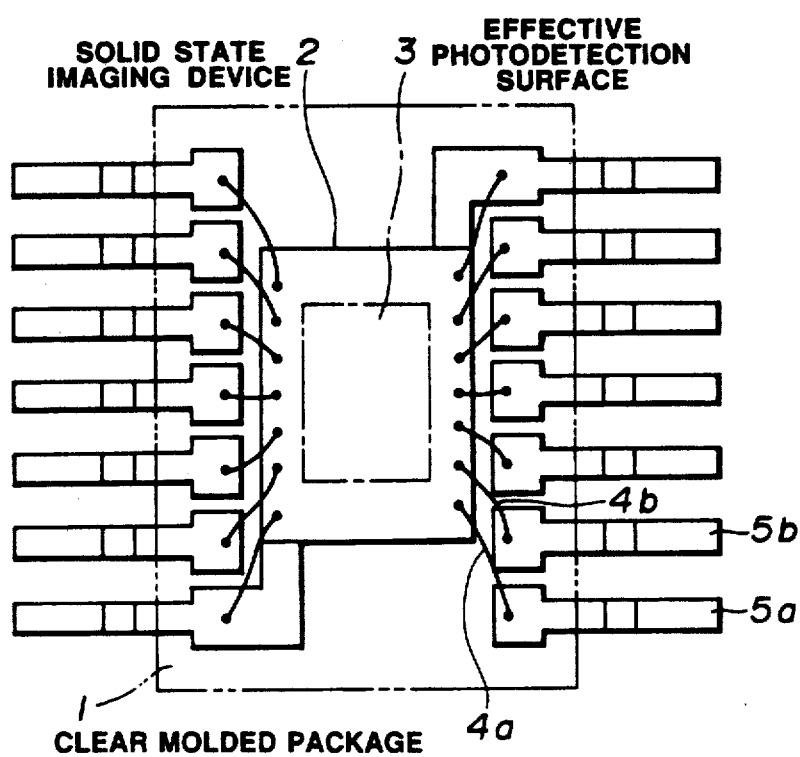
FIG. 1 is a plan view of a solid state imaging apparatus showing an embodiment of the present invention.
Figure 2:
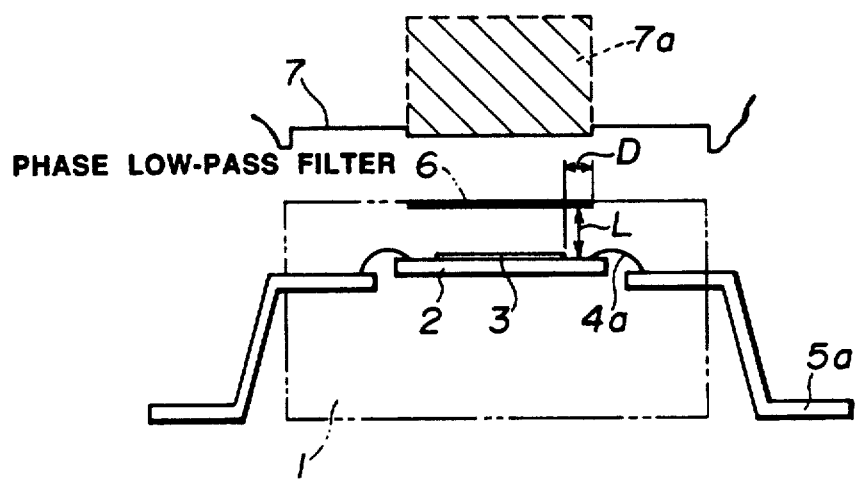
FIG. 2 is a side view of the solid state imaging apparatus of the embodiment of FIG. 1.

FIGS. 1 and 2 are respectively a plan view and side view of a solid state imaging apparatus showing an embodiment of the present invention.

As shown in FIGS. 1 and 2, a solid state imaging device 2 consisting of a CCD chip is provided in the central part with a substantial light receiving surface 3 having approximately 330,000 pixels. A plurality of leads 5a, 5b, . . . for inputting and outputting signals are connected to the solid state imaging device 2 through a plurality of bonding wires 4a, 4b, . . . . The solid state imaging device 2 is covered on the outside with a clear molded package 1.

Figure 3:
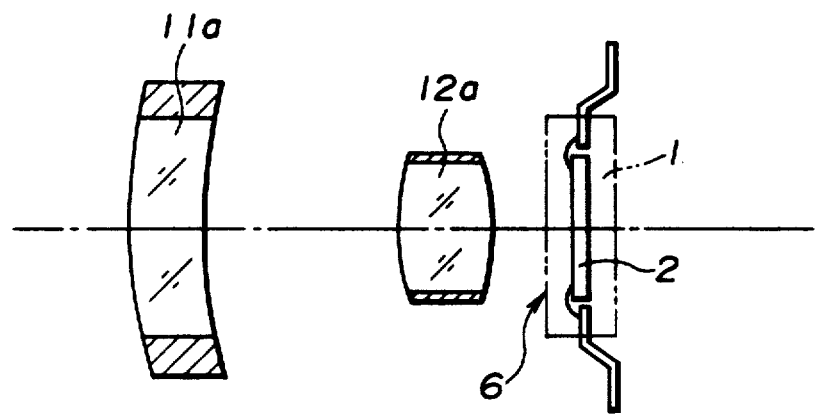
FIG. 3 is an arrangement view of an imaging optical system including the solid state imaging apparatus of the FIG. 1 embodiment.

FIG. 3 is an arrangement view of an imaging optical system including the solid state imaging apparatus of this embodiment. Nothing is interposed between the optical system consisting of zoom lens groups 11a and 12a formed of two groups and the above mentioned clear molded package 1.

As shown in FIG. 2, this clear molded package 1 is obtained by molding an organic material with a mold 7. The central part of this mold 7 is made a changeable core so that a phase LPF 6 explained in the later mentioned FIG. 4 may be precisely molded. The above mentioned phase LPF 6 is provided as separated in a forward direction by a distance L from the substantial light receiving surface 3 and its dimensions are (See FIG. 2) larger respectively by a distance D outward from the edge of the substantial light receiving surface 3 as explained in the later mentioned FIGS. 6 and 7.

Figure 4:
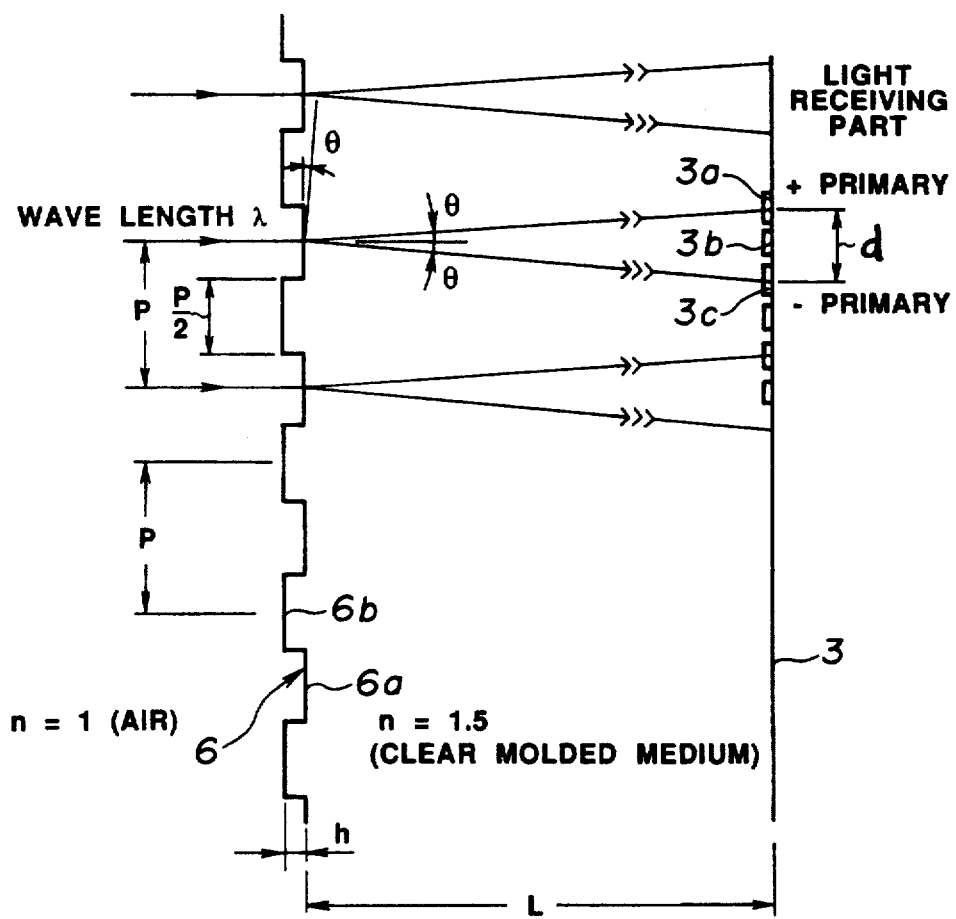
FIG. 4 is a light path diagram between a substantial light receiving surface and phase LPF in the FIG. 1 embodiment.

FIG. 4 is a light path diagram between the substantial light receiving surface 3 and phase LPF 6 shown in FIGS. 1 and 2. The separation of the image by the diffraction effect of the incident light shall be explained in the following with FIG. 4. By the way, in FIG. 4, the phase LPF 6 is shown in one dimension but, needless to say, may be shown in a matrix of two dimensions.

In FIG. 4, projections 6b and recesses 6a are alternately provided at a fixed repeated pitch P on the front surface of the phase LPF 6. Therefore, the widths of the recess 6a and projection 6b are both P/2 and the head (i.e. height or depth) of each is h. A plurality of unit pixels 3a, 3b, 3c, . . . are separately provided on the substantial light receiving surface 3 arranged as separated by a distance L from the front surface of phase LPF 6. By the way, the section of the above mentioned distance L is filled with a clear molding medium of a refractive index n of;

$$n = 1.5.$$

Now, when an object light of a wavelength λ is incident at right angles upon the front surface of this phase LPF 6 from air of n=1, the recesses 6a and projections 6b will operate as a diffraction grating and will therefore shift up and down by an angle θ. Therefore, on the substantial light receiving surface 3 separated by the distance L, dot images will separate on the unit pixels 3a and 3c separated by a separating width d and an optical LPF effect will be thereby developed.

Figure 5:
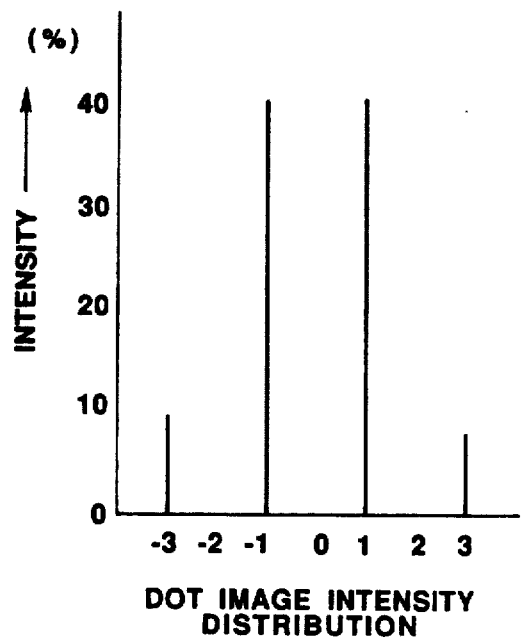
FIG. 5 is a diagram showing a dot image intensity distribution in the FIG. 1 embodiment.

FIG. 5 is a diagram showing a dot image intensity distribution.

Now, in case the front surface of the above mentioned phase LPF 6 has no recess and projection array and is a flat even surface as in the conventional example, a dot image will be produced in the position of O on the abscissa and therefore a line of an intensity of 100% will stand in this position of O.

However, as shown in FIG. 4, if the array of recesses and projections is provided on the front surface of the above mentioned phase LPF 6, as shown in FIG. 5, a primary diffracting light of a substantial intensity of 40% will stand in the position of ±1 on the abscissa. Further, a secondary diffracting light will stand in the position of ±3 with an intensity of approximately 10% and, in the same manner, a tertiary and subsequent diffracting lights will follow. However, actually contributing to the image formation and performing a main role is the primary diffracting light and therefore the secondary and subsequent diffracting lights are neglected.

Generally, if the separation width d of the image by the diffraction effect in the above mentioned FIG. 4, that is, the blur of the image becomes twice as large as the pixel pitch, the moire will be able to be extinguished. Therefore, in order to extinguish the moire, the pitch P necessary for the phase LPF shall be determined by the following calculation.

Now, if a solid state imaging device of 330,000 pixels is to be formed in ⅓ inch, the number of pixels in the horizontal direction will be 670 pixels. As the length in the horizontal direction is approximately 6.4 mm, about 100 photoelectric transducer devices will be arranged per mm. Therefore, the Nyquist frequency rc will be 50 per mm. If the head h between the recess 6a and projection 6b on the phase LPF 6 is set to be equal to the wavelength α of the incident light, the pitch P of the phase LPF 6 will be given by the below mentioned approximate formula (1):

$$P = 2L\lambda/nd \qquad \ldots (1)$$

wherein L represents a distance between the phase LPF and the solid state imaging device, λ represents a wavelength of an object light, n represents a refractive index of a clear molding medium and d represents a separating width of an image by the diffraction effect.

If, as examples of concrete numerical values, $$L = 0.3 \text{ mm},$$

$$n = 1.5,$$

$$\lambda = h = 0.55 \times 10^{-3} \text{ mm and}$$

$$d = 1/rc = 0.02 \text{ mm from } rc = 50/\text{mm},$$

are substituted in the above mentioned formula (1), about 0.11 will be obtained as the pitch P of the phase LPF. That is to say, if a pitch of about 0.11 mm is used in such phase LPF as is shown in FIG. 4, the moire will be able to be removed.

The above is a specification of a phase low pass filter formed on the light receiving side surface of the clear molded package covering the solid state imaging device. Such phase LPF may be provided on the entire light receiving side surface of the clear molded package but, as a considerably high precision work is required, the range is desirable to be as small as possible.

Therefore, a part 7a of the above mentioned mold 7 for forming the clear molded package 1 is made the changeable core as shown in the above mentioned FIG. 2 so that, when pressed with this changeable core, the recesses and projections on the substantial light receiving surface 3 will be formed. In this case, as the contour size of the phase LPF 6 must be larger than that of the substantial light receiving surface 3 of the solid state imaging device 2, this space will be required by D (See FIG. 2) on one side and shall be explained in the following by using FIGS. 6 and 7.

Figure 6:
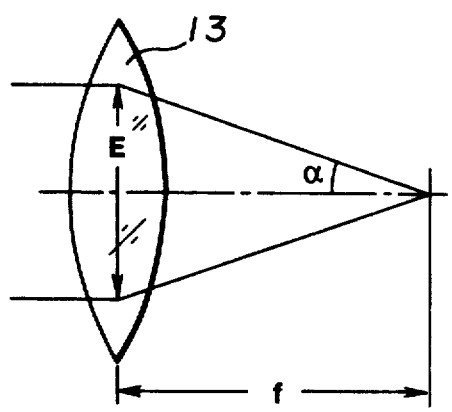
FIG. 6 is a light path diagram of an object light having passed through an imaging lens in the FIG. 1 embodiment.
Figure 7:
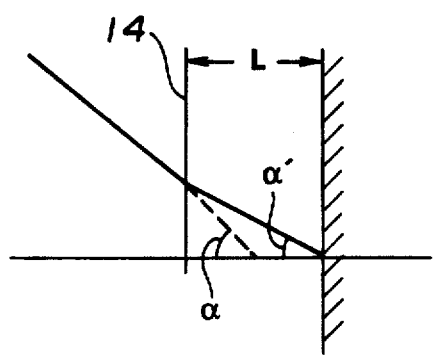
FIG. 7 is a light path diagram when an object light having passed through an imaging lens in the embodiment of FIG. 1 is radiated to a medium of a refractive index n from air.
Figure 8:
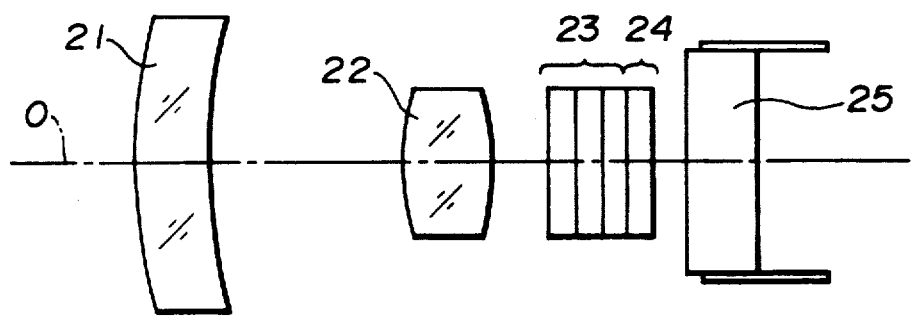
FIG. 8 is an arrangement view of an imaging optical system in a conventional solid state imaging apparatus.

FIG. 6 is a light path diagram of an object light having passed through an imaging lens 13 of an incident pupil E. The object light is incident at an incident angle $\alpha$ upon the imaging device surface located at a focal distance f. In case the light path of this object light spans air and a medium of a refractive index n, as shown in FIG. 7, the light will be refracted on the boundary surface 14 between them, therefore the above mentioned incident angle $\alpha$ will become $\alpha'$ and the light will be radiated on the imaging device surface provided as separated by the distance L from the above mentioned boundary surface 14.

Therefore, if the F number of the imaging lens is F, the refractive index of the clear molded package is n and the distance between the phase LPF 6 and substantial light receiving surface 3 is L, the above mentioned space D will be given by the below mentioned formula (2):

$$D = L / 2nF \quad \ldots (2).$$

That is to say, if the size of the phase LPF 6 provided on the light receiving side surface of the clear molded package 1 is made larger on one side than the size of the substantial light receiving surface 3 of the solid state imaging device 2 by D which is a function of the F number of the imaging lens, a necessary and sufficient optical high-frequency cut off characteristic will be able to be obtained and the moire will be able to be removed.

As the phase LPF 6 which is larger on one side by D given by the above mentioned formula (2) than the size of such substantial light receiving surface can be formed by the liner 7a as described above, even in case an expected performance as of the phase LPF can not be developed, the mold 7 need not be re-made but only the liner 7a may be re-made.

Also, in cutting infrared rays, the imaging lens may be coated to cut infrared rays but, if a color for cutting infrared rays is blended in the clear resin itself, the clear molded package 1 formed by covering the solid state imaging device will be able to be used for both of the phase LPF and infrared ray cutting filter.

According to the above described embodiment, there are obtained such effects that:

(1) An LPF such as a crystal LPF or phase LPF need not be separately provided, the mold cost for it is not required, the part cost and the number of assembling steps can be reduced and further an infrared ray cutting filter can be also used as combined; and (2) As nothing is interposed between the optical system and the clear molded package formed to cover the solid state imaging device, the lens back can be made small, the freedom of the optical design increases and the lens can be easily made small in size and high in performance. A very simple formation of only an imaging optical system and imaging apparatus can be made.

In this invention, it is apparent that working modes different in a wide range can be formed on the basis of this invention without departing from the spirit and scope of the invention. This invention is not restricted by any specific embodiment except being limited by the appended claims.

What is claimed is:

1. A solid state imaging apparatus having a clear molded package covering a solid state imaging device, characterized in that a phase low pass filter is formed on a surface of a light receiving side of said clear molded package.

2. A solid state imaging apparatus according to claim 1 characterized in that said phase low pass filter is formed by alternately providing projections and recesses at a fixed repeated pitch on the surface of the light receiving side of said solid state imaging device.

3. A solid state imaging apparatus according to claim 1 characterized in that said phase low pass filter can cut at least infrared rays.

4. A solid state imaging apparatus according to claim 1 characterized in that a light incident on said surface is diffracted by the phase low pass filter formed on the light receiving side surface of the clear molded package.

5. A solid state imaging apparatus according to claim 1 further including an imaging optical system performing an image on said solid state imaging device and being spaced from a surface of the clear molded package by a predetermined gap distance;

said gap distance space being free of any element which might intercept at least a portion of an incident light beam formed on a light receiving surface of said solid state imaging device by said imaging optical system.

6. A solid state imaging apparatus having a clear molded package covering a solid state imaging device, characterized in that a phase low pass filter is formed on a surface of a light receiving side of said clear molded package;

said phase low pass filter being formed only on a part of the surface of the light receiving side of said solid state imaging device.

7. A solid state imaging apparatus having a clear molded package covering a solid state imaging device, characterized in that a phase low pass filter is formed on a surface of a light receiving side of said clear molded package;

said solid state imaging device including a substantial light receiving surface, the size of said phase low pass filter being expanded at least to a range capable of intercepting the incident light beam formed by an imaging lens on the substantial light receiving surface of said solid state imaging device.

8. A method for producing a solid state imaging apparatus comprising the steps of:

providing a solid state imaging device having a light receiving surface comprised of a two-dimensional array of light sensitive pixels;

molding a light transmissive organic material upon said light receiving surface, said light transmissive material having a refractive index which is greater than that of air; and forming a pattern on a surface of the material through which light rays enter for ultimate impingement upon the light receiving surface, said pattern being designed to create on said array a blur image of the image impinging upon said pattern, said blur image being substantially twice as great as the pixel pitch distance between the centers of adjacent pixels.

9. The method of claim 8 wherein the step of forming said pattern further comprises the step of:

forming projections and recesses arranged in alternating fashion in mutually perpendicular directions on the surface of the molded material wherein the width of the projections and recesses are substantially uniform and the width and depth of the projections and recesses together with the distance between the pattern surface and the pixel array are chosen so as to create the blur image which is substantially twice as large as the pixel pitch.

10. The method of claim 9 wherein the aforementioned values are determined from the equation: $P_A = 2L\lambda/nd$, wherein L is the distance between the surface pattern and the pixel array, $\lambda$ is the wavelength of the impinging light rays, n is the refractive index of the molding material, d is the separating width of an image (i.e. the image blur) due to the diffraction effect, and $P_A$ represents the pitch of the projections and recesses of the array on the surface of the molded material, and $\lambda = h$, where h is the depth of said recesses.

11. The method of claim 10 wherein the step of forming the array utilized to eliminate moire further includes the step of:

forming the pattern of a size greater than the size of the pixel array wherein the size of said pattern has a length greater than the length of the pixel array measured in the same direction such that the difference between the length of the pattern and the length of the pixel array is $2 \times D$, D being given by the equation $D = L/2nF$, where L is the distance between the pattern and the pixel array, n is the index of refraction of the molded material, and F is the F number of an imaging lens for forming the image of an object on said pattern.

12. An imaging system having an imaging optical means for focusing an image on an image plane, comprising:

a solid state imaging device located in said image plane, said image plane being formed on said imaging device;

a clear molded package enclosing said solid state imaging device and having a receiving surface through which light rays representing an image pass in moving toward said solid state imaging device;

a phase type low pass filter being formed in said receiving surface;

said solid state imaging device and said phase type low pass filter being separated by a space which is free of any element which might intercept at least a portion of an incident light beam formed on a substantial light receiving surface of said solid state imaging device by said imaging optical system provided for forming an image;

said phase type low pass filter comprising means for substantially eliminating a moire effect.

13. An imaging system according to claim 12 wherein said space if filled with material forming said clear molded package.

14. A photographing system comprised of an imaging optical system;

a solid state imaging device;

a clear molded package enclosing said solid state imaging device, said package including a phase low-pass filter; and a space between said optical system and a surface of said clear molded package being free of any elements which might obstruct light rays passing through said optical system and directed toward said solid state imaging device from impinging upon said solid state imaging device.

15. An imaging system according to claim 14 wherein a space between the surface of said package and said solid state imaging device is filled with material forming said clear molded package.

* * * * *

UNITED STATES PATENT AND TRADEMARK OFFICE
CERTIFICATE OF CORRECTION

PATENT NO. : 5,283,691
DATED : February 1, 1994
INVENTOR(S) : Ogasawara

It is certified that error appears in the above-indentified patent and that said Letters Patent is hereby corrected as shown below:

Column 4, line 36, change "$\alpha$" to --$\lambda$--

Column 8, line 21, change "if" to --is--

Signed and Sealed this

Twelfth Day of July, 1994

Attest:

BRUCE LEHMAN

*Attesting Officer*     *Commissioner of Patents and Trademarks*